(12) United States Patent
Yi (10) Patent No.: US 8,562,741 B2
(45) Date of Patent: *Oct. 22, 2013

(54) EVAPORATION SOURCE FOR EVAPORATING AN ORGANIC ELECTROLUMINESCENT LAYER

(75) Inventor: Kyung-Soo Yi, Yeongi-gun (KR)

(73) Assignee: LG Display Co., Ltd., Seoul (KR)

( * ) Notice: Subject to any disclaimer, the term of this patent is extended or adjusted under 35 U.S.C. 154(b) by 1410 days.

This patent is subject to a terminal disclaimer.

(21) Appl. No.: 11/514,260

(22) Filed: Sep. 1, 2006

(65) Prior Publication Data
US 2006/0288939 A1    Dec. 28, 2006

Related U.S. Application Data

(62) Division of application No. 10/909,353, filed on Aug. 3, 2004, now abandoned.

(30) Foreign Application Priority Data

| Aug. 4, 2003 | (KR) | 2003-53761 |
| Aug. 14, 2003 | (KR) | 2003-56606 |
| Sep. 3, 2003 | (KR) | 2003-61351 |
| Sep. 3, 2003 | (KR) | 2003-61352 |

(51) Int. Cl.
*C23C 16/00* (2006.01)

(52) U.S. Cl.
USPC .......................................... 118/715; 118/726

(58) Field of Classification Search
USPC ................................................ 118/726, 715
See application file for complete search history.

(56) References Cited

U.S. PATENT DOCUMENTS 2,440,135 A  * 4/1948  Alexander .................. 427/248.1
3,153,137 A    10/1964 Drumheller
(Continued)

FOREIGN PATENT DOCUMENTS

| DE | 262551 A3 | 12/1988 |
| JP | 60-255971 A | 12/1985 |
| JP | 2004-214185 | * 7/2004 |

OTHER PUBLICATIONS

V. Kuznetsov et al. "Production of Thin Films of Silicon Monoxide Without Through Holes." vol. 1968, No. 3, May 1, 1968, pp. 723-724, XP002300025.

*Primary Examiner* — Parviz Hassanzadeh
*Assistant Examiner* — Satish Chandra
(74) *Attorney, Agent, or Firm* — Birch, Stewart, Kolasch & Birch, LLP (57) ABSTRACT

The present invention relates to an evaporation source for evaporating an organic electroluminescent layer. In particular, the present invention relates to the evaporation source preventing an aperture, through which a vaporized evaporation material is emitted, from being clogged by restricting heat transfer to outward. The evaporation source according to the present invention includes a cell retaining an evaporation material therein; a cell cap installed on the upper part of the cell and having a cell cap aperture for emitting a vaporized evaporation material; an external wall placed in the outside of the cell to support a heating means set up at the outside of the cell; a cover placed above the cell cap, fixed to the upper end of the external wall, and having a cover aperture corresponding to the cell cap aperture; and a shut-off plate placed between the cover and the cell cap and having a shut-off plate aperture corresponding to the cell cap aperture and the cover aperture in the center of the shut-off plate.

6 Claims, 6 Drawing Sheets

(56) References Cited

U.S. PATENT DOCUMENTS

| | | | |
|---|---|---|---|
| 3,170,018 A | 2/1965 | Lewis | |
| 3,190,412 A | 6/1965 | Rutter et al. | |
| 3,327,041 A * | 6/1967 | Clune et al. | 373/110 |
| 4,565,158 A | 1/1986 | Koprio et al. | |
| 4,659,601 A * | 4/1987 | Elliott et al. | 428/591 |
| 5,034,604 A | 7/1991 | Streetman et al. | |
| 5,104,293 A * | 4/1992 | Eaton et al. | 416/241 B |
| 5,157,240 A | 10/1992 | Chow | |
| 5,182,567 A | 1/1993 | Wilder | |
| 5,253,266 A | 10/1993 | Knodle, III et al. | |
| 5,272,298 A | 12/1993 | Taguchi et al. | |
| 5,336,324 A | 8/1994 | Stall et al. | |
| 5,424,139 A * | 6/1995 | Shuler et al. | 428/596 |
| 5,431,735 A | 7/1995 | Briones et al. | |
| 5,545,437 A * | 8/1996 | Nagaraj et al. | 427/404 |
| 5,803,976 A * | 9/1998 | Baxter et al. | 118/726 |
| 5,901,428 A * | 5/1999 | Sheridan | 29/509 |
| 6,202,591 B1 | 3/2001 | Witzman et al. | |
| 7,087,143 B1 * | 8/2006 | Schmidt et al. | 204/224 R |
| 2003/0047141 A1 * | 3/2003 | Warnes et al. | 118/726 |
| 2003/0054100 A1 | 3/2003 | Eser et al. | |
| 2005/0023267 A1 * | 2/2005 | Timans et al. | 219/405 |

* cited by examiner

FIG. 1

PRIOR ART

FIG. 2

PRIOR ART

EVAPORATION SOURCE FOR EVAPORATING AN ORGANIC ELECTROLUMINESCENT LAYER

CROSS-REFERENCE TO RELATED APPLICATIONS

This application is a Divisional of application Ser. No. 10/909,353 filed on Aug. 3, 2004, now abandoned for which priority is claimed under 35 U.S.C. §120. This application also claims priority from Korean Patent Application Nos. 2003-53761, filed on Aug. 4, 2003, 2003-56606, filed on Aug. 14, 2003, 2003-61351, filed on Sep. 3, 2003 and 2003-61352, filed on Sep. 3, 2003. The contents of each of these applications are incorporated herein by reference in their entirety.

BACKGROUND OF THE INVENTION

1. Field of the Invention

The present invention relates to an evaporation source for evaporating an organic electroluminescent layer. In particular, the present invention relates to the evaporation source preventing an aperture, through which a vaporized evaporation material is emitted, from being clogged by restricting heat transfer to outward.

2. Description of the Related Art

Thermal, physical vacuum evaporation is a technique for forming an organic electroluminescent layer on a substrate by emitting a vaporized evaporation material (organic material). In this evaporation process, an evaporation material retained in a vessel is heated to evaporation temperature, and after emitted from the vessel, the vaporized evaporation material is coated on the substrate. This process is carried out in a chamber whose pressure is maintained between $10^{-7}$ and $10^{-2}$ Torr, wherein the vessel retaining the evaporation material and the substrate is installed in the chamber.

Generally, the evaporation source, which is the vessel retaining the evaporation material, is made of an electrical resistance material, wherein the temperature of the electrical resistance material increases when the electric current flows through the walls of the evaporation source. When the electric current is applied to the evaporation source, the evaporation material retained therein is heated by radiation heat and conduction heat transferred from the walls of the evaporation source. An aperture for emitting the vaporized evaporation material to outward is formed on the upper surface of the evaporation source.

Figure 1:
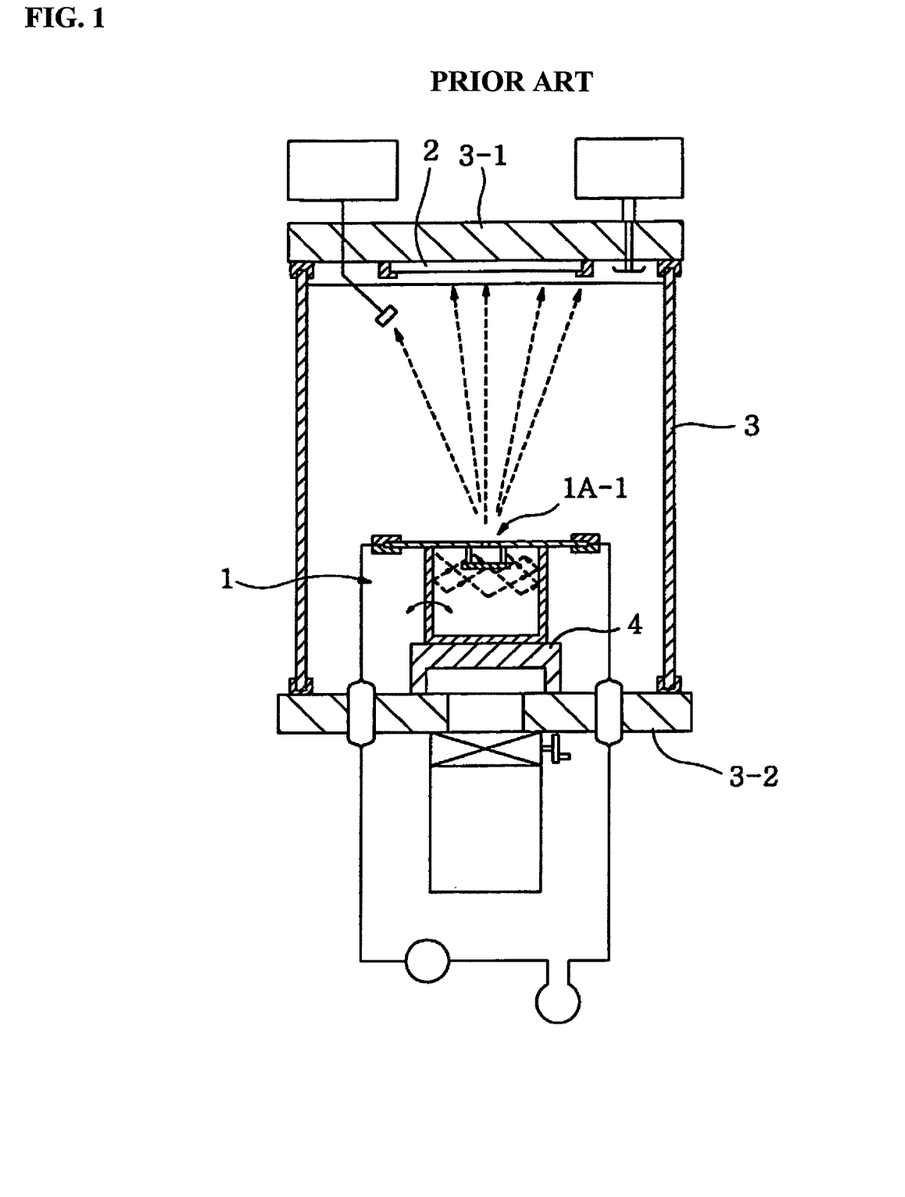
FIG. 1 is a sectional view showing the inner configuration of the vacuum evaporation apparatus equipped with a conventional evaporation source.

FIG. 1 is a sectional view showing the inner configuration of the vacuum evaporation apparatus equipped with a conventional evaporation source. The evaporation source 1 is installed in the chamber 3 of the evaporation apparatus, and the substrate 2 is placed above the evaporation source 1.

The substrate 2 on which the organic electroluminescent layer is evaporated is mounted on an upper plate 3-1 of the chamber 3, wherein the substrate 2 can be fixed or installed to move widthwise. A general configuration of the vacuum evaporation apparatus is to mount the substrate 2 on the upper plate 3-1 to move horizontally, and thus the explanation about this configuration is omitted.

The evaporation source 1 is installed on an insulated structure 4 fixed to a base 3-2 of the chamber 3, and connected to a cable for supplying electric power. The evaporation source 1 is capable of moving horizontally widthwise as well as being fixed to the insulated structure 4. Another general configuration of the vacuum evaporation apparatus is to install the evaporation source 1 on the insulated structure 4 to move horizontally, and thus the explanation about this configuration is also omitted.

The aperture 1A-1 formed on the upper surface of the evaporation source 1 is shown in FIG. 1, wherein the evaporation material vaporized in the evaporation source 1 is emitted through the aperture 1A-1 to outward in the direction of the substrate 2. Generally, the evaporation sources are classified into point evaporation source and linear evaporation source depending on the shape of evaporation source and aperture.

The entire shape of the point evaporation source is cylindrical, and the shape of its aperture is circular. The entire shape of the linear evaporation source is hexahedral, and the shape of its aperture is rectangular.

The selection of evaporation source is determined by considering the conditions of evaporation process and substrate, and the shape of evaporation layer to be formed. For convenience's sake, the point evaporation source will be explained below.

Figure 2:
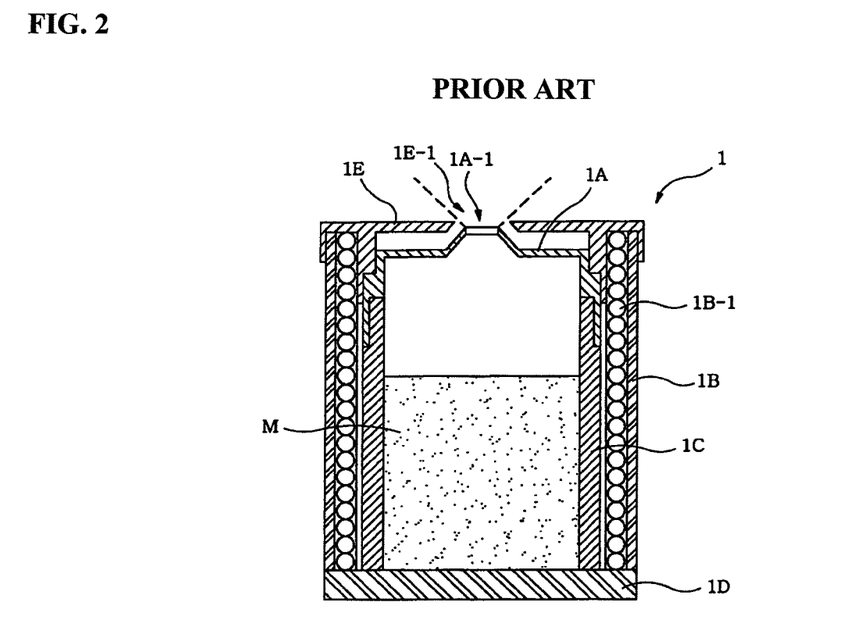
FIG. 2 is a sectional view showing a conventional point evaporation source.

FIG. 2 is a sectional view showing a conventional point evaporation source. The point evaporation source 1 comprises a cell 1C, a base 1D and a cell cap 1A. The evaporation material, which is an organic material, is retained in the inner space formed by the cell 1C, the base 1D and the cell cap 1A.

A heating means 1B-1, for example, an electric resistance coil connected to electric power, is placed between the cell 1C and an external wall 1B to heat the evaporation material M retained in the inner space. The heating means 1B-1 is installed for the cell 1C of the entire height to heat the entire evaporation material M.

A cell cap aperture 1A-1 is formed in the center of the cell cap 1A, wherein the vaporized evaporation material M heated by the heating means 1B-1 is emitted through the cell cap aperture 1A-1 to outward, that is, to the direction of the substrate 2.

The temperature around the cell cap aperture 1A-1 is lower than the temperature of the inner space in which the vaporized evaporation material is generated because the cell cap 1A has no additional heating means installed thereon, and is exposed to the outside. Therefore, a part of the vaporized evaporation material emitted through the cell cap aperture 1A-1 is deposited around the cell cap aperture 1A-1 due to lower temperature thereabout.

As the evaporation process continues, the amount of the deposited evaporation material increases. Therefore, fluent emission of the vaporized evaporation material is not carried out, and in the end, the cell cap aperture 1A-1 is clogged by increase of the deposited evaporation material.

In order to prevent the vaporized evaporation material from being deposited around the cell cap aperture 1A-1, it is necessary that the temperature of the cell cap aperture 1A-1 or the cell cap 1A should keep above a predetermined temperature. Therefore, in order to do so, a cover 1E, made of metallic material, is mounted on the upper end of the external wall 1B as shown in FIG. 2, wherein the shape of the cover 1E is of a circular plate.

The cover 1E mounted on the upper end of the external wall 1B is placed on the cell cap 1A, and maintains a predetermined space from the cell cap 1A. A cover aperture 1E-1 for emitting the vaporized evaporation material is formed on the cover 1E to correspond to the cell cap aperture 1A-1. Therefore, the cell cap 1A may maintain a predetermined temperature because the cover 1E prevents the heat transferred from the cell cap 1A from being emitted to outward.

However, the heat transferred from the cell cap 1A is emitted to outward because the cover 1E is metallic. Therefore, the cell cap 1A cannot maintain a predetermined temperature, and so the deposition of the vaporized evaporation material around the cell cap aperture 1A-1 cannot be completely prevented.

SUMMARY OF THE INVENTION

The object of the present invention is to provide an evaporation source for preventing a vaporized evaporation material from being deposited around an aperture formed on a cell cap by inhibiting heat transferred to the cell cap having the aperture from heating means from being emitted to outward, and thus enabling the cell cap to maintain a predetermined temperature.

The evaporation source according to one embodiment of the present invention includes a cell retaining an evaporation material therein; a cell cap installed on the upper part of the cell, and having a cell cap aperture for emitting a vaporized evaporation material; an external wall placed in the outside of the cell to support a heating means set up at the outside of the cell; a cover placed above the cell cap, fixed to the upper end of the external wall, and having a cover aperture corresponding to the cell cap aperture; and a shut-off plate placed between the cover and the cell cap and having a shut-off plate aperture corresponding to the cell cap aperture and the cover aperture in the center of the shut-off plate.

The evaporation source according to another embodiment of the present invention includes a cell retaining an evaporation material therein; a cell cap installed on the upper part of the cell, and having a cell cap aperture for emitting a vaporized evaporation material; an external wall placed in the outside of the cell to support a heating means set up at the outside of the cell; a cover placed on the cell cap, fixed to the upper end of the external wall, and having a cover aperture corresponding to the cell cap aperture; and an upper reflector and a lower reflector having an upper aperture and a lower aperture corresponding to the cover aperture in the center thereof respectively and placed above the cover to prevent heat from being emitted to the outside of the cover, wherein the upper reflector is placed above the lower reflector.

The evaporation source according to another embodiment of the present invention includes a cell retaining an evaporation material therein; a cell cap installed on the upper part of the cell and having a cell cap aperture for emitting a vaporized evaporation material; an external wall placed in the outside of the cell to support a heating means set up at the outside of the cell; and a reflector comprising a body placed above the cell cap, a metal layer placed on the lower surface of the body and a supporting member mounted on the body to contact the surface of the cell cap, wherein the body, made of a low conductivity material, has an reflector aperture corresponding to the cell cap aperture in the center thereof, and the metal layer has a low emissivity value.

The evaporation source according to another embodiment of the present invention includes a cell retaining an evaporation material therein; a cell cap installed on the upper part of the cell and having a cell cap aperture for emitting a vaporized evaporation material; an external wall placed in the outside of the cell to support a heating means set up at the outside of the cell; and a cover contacting the upper surface of the cell cap, fixed to the upper end of the external wall, and having a cover aperture corresponding to the cell cap aperture.

Therefore, the vaporized evaporation material is not deposited around the cell cap aperture because the temperature of the cell cap remains at a predetermined temperature while the vaporized evaporation material is emitted to outward, and the evaporation layer is formed on the substrate.

BRIEF DESCRIPTION OF THE DRAWINGS

The above and other features and advantages of the present invention will be more clearly understood from the following detailed description taken in conjunction with the accompanying drawings.

DESCRIPTION OF EMBODIMENTS

Hereinafter, preferred embodiments of the present invention will be explained in more detail with reference to the accompanying drawings.

The First Embodiment

Figure 3:
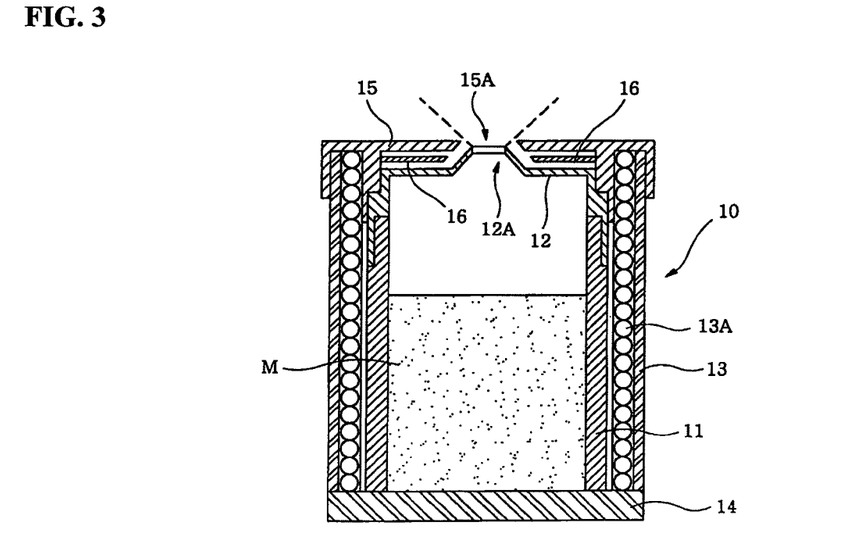
FIG. 3 is a sectional view showing the point evaporation source according to the first embodiment of the present invention.

FIG. 3 is a sectional view showing the point evaporation source according to the first embodiment of the present invention. The point evaporation source 10 according to the first embodiment of the present invention comprises a cell 11 which is cylindrical, a cell cap 12 on which a cell cap aperture 12A for emitting the vaporized evaporation material is formed, an external wall 13 which is cylindrical, and base 14. A heating means 13A is placed between the cell 11 and the external wall 13.

A cover 15 fixed to the upper end of the external wall 13 is placed on the cell cap 12 with maintaining a predetermined distance from the cell cap, wherein the shape of the cover 15 is of a circular plate. A cover aperture 15A formed on the cover 15 corresponds to the cell cap aperture 12A.

In order to prevent the heat of the cell cap 12 from being transferred to outward, a shut-off plate 16 is placed between the cover 15 and the cell cap 12, and is level with the cover 15 and the cell cap 12, wherein the outer circumferential surface of the shut-off plate 16 is fixed to the inner circumferential surface of the cover 15. Also, the shut-off plate 16 may be placed between the cover 15 and the cell cap 12 by fixing each end of a plurality of supporting rods (not shown) to the upper surface of the shut-off plate 16 and the lower surface of the cover 15 together.

The shut-off plate 16 has a shut-off plate aperture corresponding to the cell cap aperture 12A and the cover aperture 15A in the center of the shut-off plate 16. Therefore, the vaporized evaporation material emitted from the cell cap aperture 12A is emitted through the shut-off plate aperture and the cover aperture 15A to outward in the direction of the substrate.

In the evaporation source according to the first embodiment of the present invention, heat is transferred from the inner space of the cell 11, in which the vaporized evaporation material is generated, to the cell cap 12, and then the heat transferred from the cell cap 12 to the cover 15 is shut off by the shut-off plate 16 placed above the cell cap 12. Therefore, the temperature between the cell cap 12 and the shut-off plate 16 remains higher than the temperature between the shut-off plate 16 and the cover 15.

Also, the temperatures of the cell cap 12 and the cell cap aperture 12A remains in a predetermined temperature, and thus the deposition of the vaporized evaporation material around the cell cap aperture 12A is prevented because the temperature of the cell cap aperture 12A is not decreased.

It is desirable for the shut-off plate 16 to be made of low conductivity material, for example, SUS material or tantalum.

The above constitution for the point evaporation source according to the first embodiment of the present invention is applicable to the linear evaporation source.

As described above, the evaporation source according to the first embodiment of the present invention can properly maintain the temperature around the cell cap aperture through shutting off the transfer of heat from the cell cap to outward, and transferring heat to the cell cap, by placing the shut-off plate, which is made of low conductivity material, between the cell cap and the cover. Therefore, such problem that the vaporized evaporation material emitted through the cell cap aperture to outward is deposited around the cell cap aperture due to the decreased temperature is efficiently prevented.

The Second Embodiment

Figure 4:
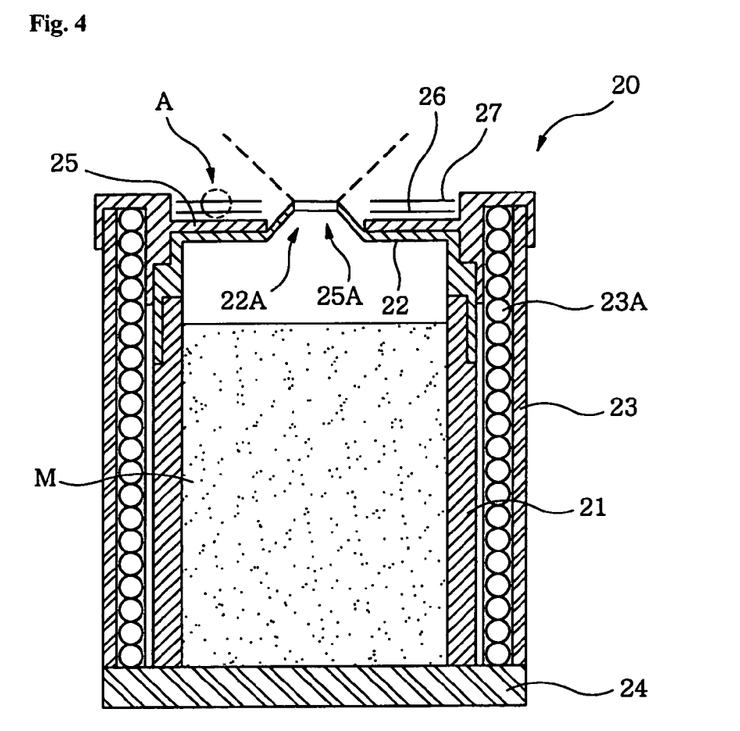
FIG. 4 is a sectional view showing the point evaporation source according to the second embodiment of the present invention.

FIG. 4 is a sectional view showing the point evaporation source according to the second embodiment of the present invention. The point evaporation source 20 according to the first embodiment of the present invention comprises a cell 21 which is cylindrical, a cell cap 22 on which a cell cap aperture 22A for emitting the vaporized evaporation material M is formed, an external wall 23 which is cylindrical, and base 24. A heating means 23A is placed between the cell 21 and the external wall 23.

The cover 25 of a circular plate shape fixed to the upper end of the external wall 23 is mounted on the cell cap 22 to contact the surface thereof. A lower reflector 26 and an upper reflector 27 are placed above the cover 25 in sequence. The lower reflector 26 contacts the upper surface of the cover 25, and the upper reflector 27 is placed above the lower reflector 26 with maintaining a predetermined distance.

Figure 5:
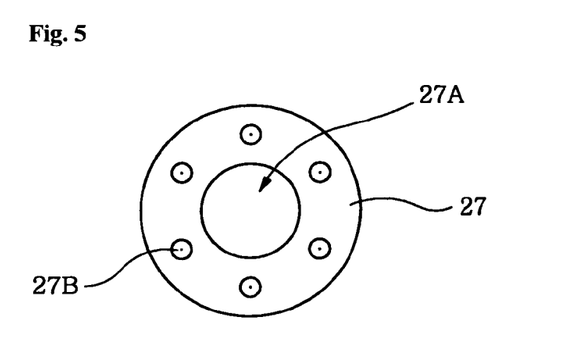
FIG. 5 is a bottom view showing the upper reflector of the point evaporation source according to the second embodiment of the present invention.
Figure 6:
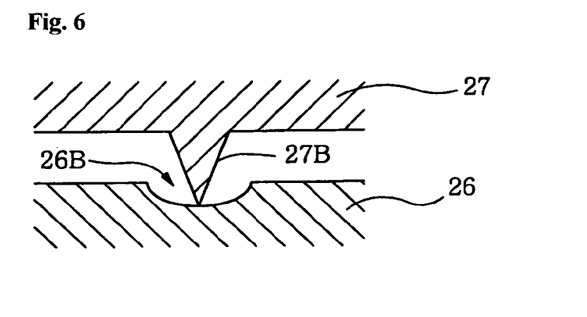
FIG. 6 is a detailed view showing part "A" of FIG. 4.

FIG. 5 is a bottom view showing the upper reflector of the point evaporation source according to the second embodiment of the present invention. FIG. 6 is a detailed view showing part "A" of FIG. 4. FIG. 5 and FIG. 6 show the correlation between the lower reflector 26 and the upper reflector 27.

The lower reflector 26 and the upper reflector 27, which are of circular plate shapes, have a lower aperture and an upper aperture corresponding to the cover aperture 25A and the cell cap aperture 22A, respectively, in their centers. Therefore, the lower reflector 26 and the upper reflector 27 have no effect to the function to emit the vaporized evaporation material.

A plurality of projections 27B are formed on the lower surface of the upper reflector 27, wherein each projection 27B is pointed at the end. Also, a plurality of recesses 26B are formed on the upper surface of the lower reflector 26, wherein each recess 26B corresponds to each projection 27B. Each projection 27B of the upper reflector 27 is retained in each recess 26B of the lower reflector 26 contacting at a point.

Each recess 26B formed on the upper surface of the lower reflector 26 has an elliptical shape in which a long principal axis is circumferentially oriented and a short principal axis is radially oriented. A plurality of the evaporation sources are circularly arranged in the vacuum evaporation apparatus, and emit the vaporized evaporation material with moving along a circular course. Under this condition, to compensate the relative motion of the upper reflector 27 to the lower reflector 26, which moves circularly with the cover 25, that is, to prevent the projection 27B contacting the recess 26B at a point from being separated from the recess 26B, each recess 26B is elliptically made.

Hereinafter, the function of the evaporation source according to the second embodiment of the present invention will be described.

The cell cap 22 remains at a predetermined temperature by the lower reflector 26 with preventing the heat transferred from the inner space of the evaporation source to the cell cap 22 and the cover 25 from being emitted to outward. The heat transferred to the lower reflector 26 is not transferred to the upper reflector 27 because the upper reflector 27 maintains a predetermined distance from the lower reflector 26 by the projections 27B. In addition, the amount of the heat transferred to the upper reflector 27 through the projections 27B is extremely little because the projection 27B contacts the recess 26B at a point.

It is desirable for the pairs of the recess 26B and the projections 27B to be at least more than three so that the upper reflector 27 is balanced on the lower reflector 26.

As described above, the evaporation source according to the second embodiment of the present invention can prevent the phenomenon that the vaporized evaporation material is deposited around the cell cap aperture, by minimizing the heat emission to outward of the evaporation source by the lower reflector and the upper reflector, and by making the cell cap and the cover placed below the lower reflector and the upper reflector maintain a predetermined temperature at any time.

The Third Embodiment

Figure 7:
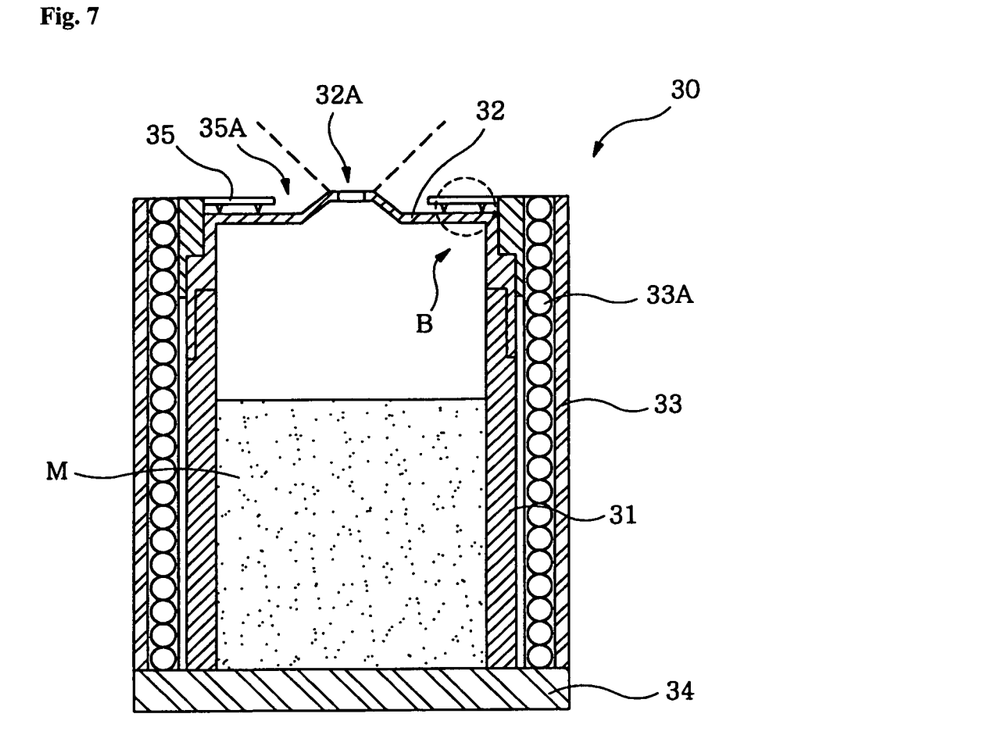
FIG. 7 is a sectional view showing the point evaporation source according to the third embodiment of the present invention.
Figure 8:
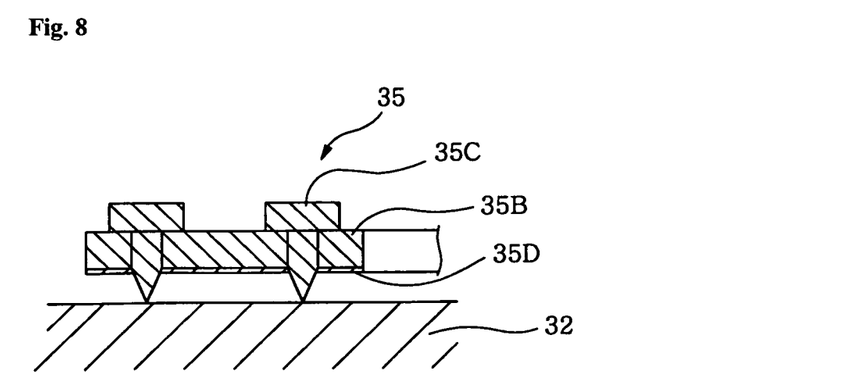
FIG. 8 is a detailed view showing part "B" of FIG. 7.

FIG. 7 is a sectional view showing the point evaporation source according to the third embodiment of the present invention. FIG. 8 is a detailed view showing part "B" of FIG. 7. The point evaporation source 30 according to the third embodiment of the present invention comprises a cell 31 which is cylindrical, a cell cap 32 on which a cell cap aperture 32A for emitting the vaporized evaporation material is formed, an external wall 33 which is cylindrical, and base 34. A heating means 33A is placed between the cell 31 and the external wall 33.

A reflector 35 fixed to the upper end of the inner circumferential surface of the external wall 33 is mounted on the cell cap 32, and level with the cell cap 32. The reflector 35 has a reflector aperture 35A corresponding to the cell cap aperture 32A in the center of the reflector 35.

The reflector 35 comprises a body 35B, a metal layer 35D placed on the lower surface of the body 35B, and a supporting member 35C mounted on the body 35B to contact the surface of the cell cap 32, wherein the body 35B is made of low conductivity metal or ceramic material.

The body 35B with low conductivity prevents the heat transfer from the cell cap 32 to outward. Also, the metal layer 35D with low emissivity value is formed on the lower surface of the body 35B to transfer the heat to the cell cap 32 again. Therefore, the cell cap 32 maintains a predetermined temperature.

The heat from the cell cap 32 is also transferred to the supporting member 35C. Therefore, in order to inhibit the heat transfer, the supporting member 35C is made of low conductivity metal or ceramic material.

The supporting member 35C and the body 35B can be integrally formed. However, in case of ceramic material, it is desirable for the supporting member 35C and the body 35B to be made separately because it is difficult to form the supporting member 35C and the body 35B integrally, wherein a bolt type or a close fit type is desirable.

It is desirable for the supporting member 35C to be at least more than four so that the supporting member 35C supports the body 35B because the supporting member 35C contacts the cell cap 32 at a point. Also, it is desirable for the supporting member 35C to be a pin type in order to minimize the contact area with the cell cap 32, but not limited thereto.

It is desirable for the body 35B and the supporting member 35C to be made of ceramic material, for example $ZrO_2$, $Al_2O_3$, $TiO_2$, and/or metal with low conductivity, for example Mn or Ti. And, it is desirable for the metal layer 35D to be made of Au, Ag, or Al.

The metal layer 35D can be formed on the lower surface of the body 35B by the thermal spray method, ECM (Electro Chemical Metalizing) method, or the electro plating method, wherein the thermal spray method comprises the flame spray method, the plasma spray method, or HVOF (High Velocity Oxygen-Fuel).

As described above, the evaporation source according to the third embodiment of the present invention can maintain the temperature of the cell cap aperture at a predetermined level by the reflector made of the different materials, preventing the heat from being emitted to outward. Therefore, the problem that the vaporized evaporation material emitted through the cell cap aperture to outward is deposited around the cell cap aperture due to the decreased temperature can be efficiently resolved.

The Fourth Embodiment

Figure 9:
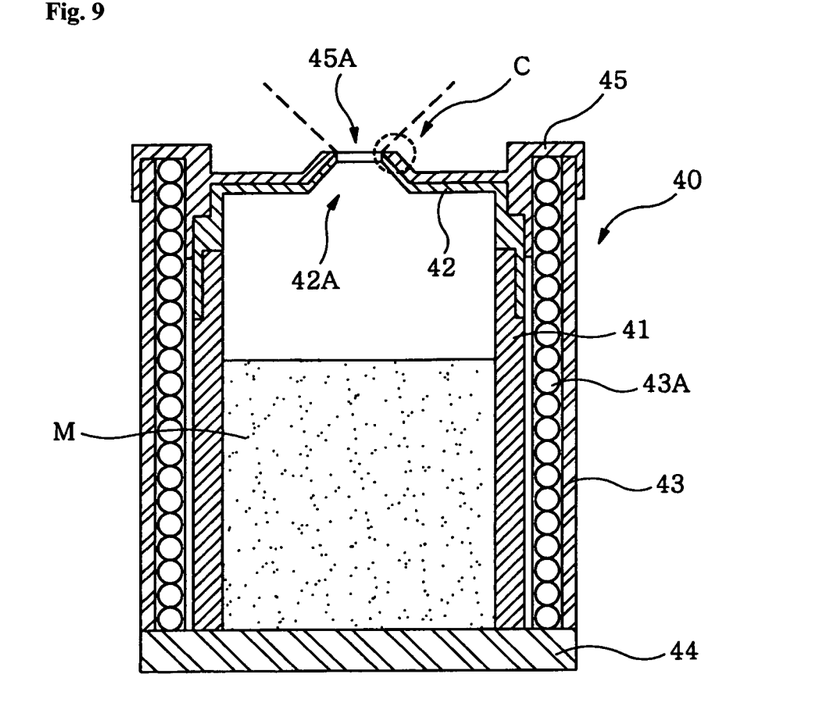
FIG. 9 is a sectional view showing the point evaporation source according to the fourth embodiment of the present invention.

FIG. 9 is a sectional view showing the point evaporation source according to the fourth embodiment of the present invention. The point evaporation source 40 according to the fourth embodiment of the present invention comprises a cell 41 which is cylindrical, a cell cap 42 on which a cell cap aperture 42A for emitting the vaporized evaporation material is formed, an external wall 43 which is cylindrical, and base 44. A heating means 43A is placed between the cell 41 and the external wall 43, and the cell cap 42 is mounted on the upper end of the cell 41.

A cover 45 fixed to the upper end of the external wall 43 is mounted on the cell cap 42 contacting the upper surface thereof to smoothly transfer the heat to the cell cap 42. The cover 45 has a cover aperture 45A corresponding to the cell cap aperture 42A.

The heat generated from the heating means 43A is transferred to the cover 45. The heat transferred to the cover 45 is transferred to the cell cap 42 contacting the cover 45. Therefore, the temperature of the cell cap aperture 42A, which is formed in the center of the cell cap 42, is not decreased due to the heat transferred from the cover 45.

It is desirable for the cover aperture 45A and the cell cap aperture 42A to have the same size. The heat generated by the heating means 43A is transferred to the cell cap aperture 42A through the cover 45 as well as the cell cap 42, thereby more efficiently maintaining the temperature of the cell cap aperture 42A at a predetermined level.

Figure 10:
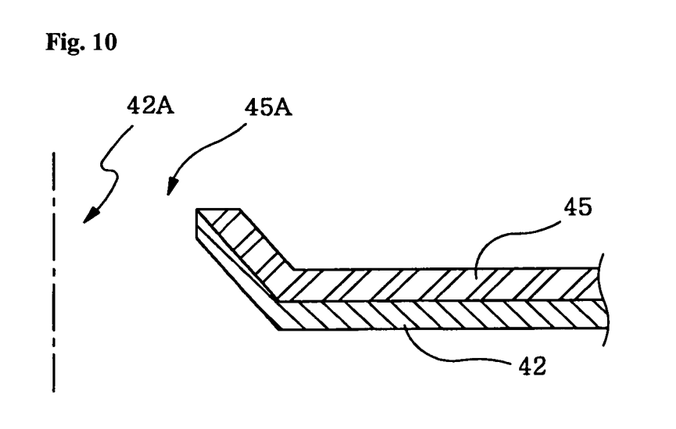
FIG. 10 is a detailed view showing part "C" of FIG. 9.

FIG. 10 is a detailed view showing part "C" of FIG. 9. In case that the cover aperture 45A and the cell cap aperture 42A have the same size, it is desirable for the thickness of the cover 45 to be decreased in the direction of the cover aperture 45A to prevent the vaporized evaporation material from being deposited on the cover 45 during the evaporation process. Therefore, the inner circumferential surface of the cover aperture 45A is sharply edged.

Figure 11:
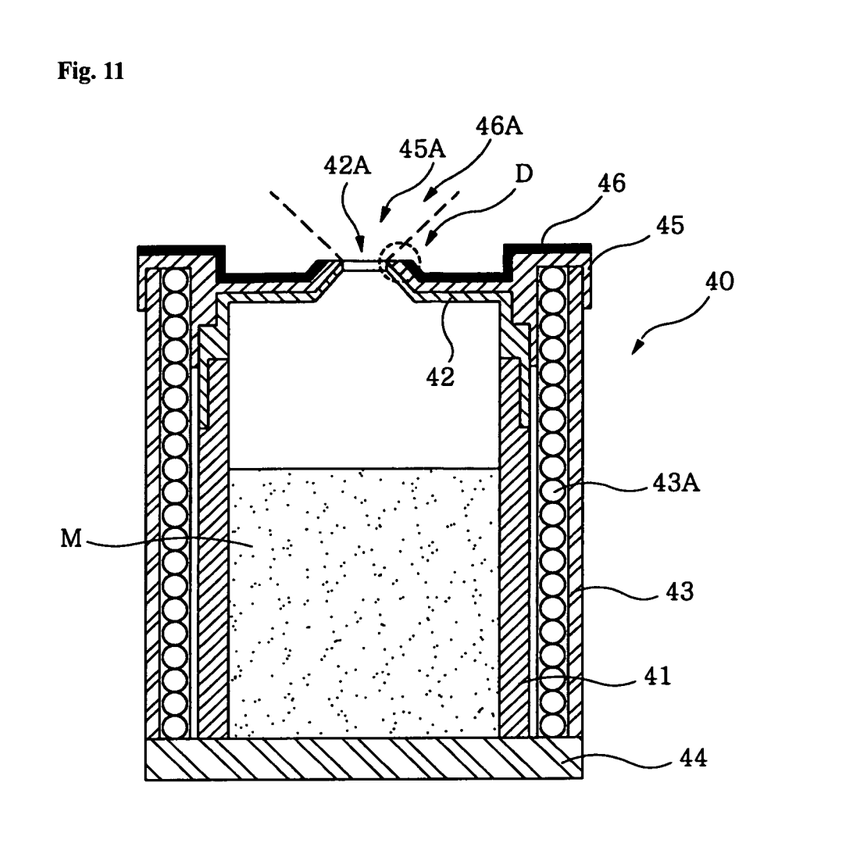
FIG. 11 is a sectional view showing another point evaporation source according to the fourth embodiment of the present invention.

FIG. 11 is a sectional view showing another point evaporation source according to the fourth embodiment of the present invention. A shut-off layer 46 is formed on the upper surface of the cover 45 fixed to the upper end of the external wall 43, wherein the shut-off layer 46 is made of low conductivity material. The shut-off layer 46 has a shut-off layer aperture 46A for emitting the vaporized evaporation material at a corresponding position to the cover aperture 45A.

The heat generated from the heating means 43A is transferred to the cover 45 made of metallic material. The heat transferred to the cover 45 is transferred to the cell cap 42 contacting the cover 45. The shut-off layer 46 formed on the upper surface of the cover 45 prevents the heat from being emitted from the cover 45 to outward. Therefore, most of the heat is transferred to the cell cap 42.

The shut-off layer 46 is made of low conductive material, for example ceramic material or metal material, wherein the ceramic material could be $Al_2O_3$, $TiO_2$, SiC, or $ZrO_2$, and the metal material could be Mn or Ti. It is desirable for the shut-off layer 46 to be formed on the cover 45 by the electro plating method.

Figure 12:
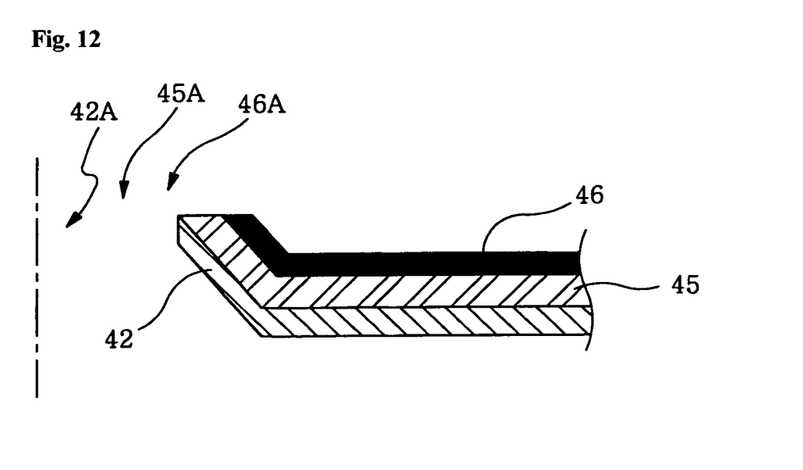
FIG. 12 is a detailed view showing part "D" of FIG. 11.

FIG. 12 is a detailed view showing part "D" of FIG. 11. In case that the shut-off layer aperture 46A is smaller than the cover aperture 45A, the vaporized evaporation material emitted through the cell cap aperture 42A to outward is deposited on the shut-off layer aperture 46A. Therefore, the shut-off layer aperture 46A is larger than the cover aperture 45A so that the vaporized evaporation material is not deposited on the shut-off layer aperture 46A.

In case that the shut-off layer aperture 46A and the cover aperture 45A have the same size, it is desirable for the thickness of the shut-off layer 46 to be decreased in the direction of the shut-off layer aperture 46A to prevent the vaporized evaporation material from being deposited on the shut-off layer 46 during the evaporation process. Therefore, the inner circumferential surface of the shut-off layer aperture 46A is sharply edged.

As described above, the evaporation source according to the fourth embodiment of the present invention can maintain the cell cap aperture at a predetermined temperature by placing the cover to contact the cell cap, thereby transferring the heat generated in the heating means to the cell cap aperture through the cover. Also, the shut-off layer formed on the upper surface of the cover prevents the heat from being emitted to outward. Therefore, the problem that the vaporized evaporation material emitted through the cell cap aperture to outward is deposited around the cell cap aperture due to the decreased temperature can be efficiently resolved.

From the above preferred embodiments for an evaporation source for evaporating an organic electroluminescent layer, it is noted that modifications and variations can be made by a person skilled in the art in light of the above teachings. Therefore, it should be understood that changes may be made for a particular embodiment of the present invention within the scope and spirit of the present invention outlined by the appended claims.

What is claimed is:

1. An evaporation source heated by applied electric power, heating an evaporation material retained in the evaporation source and emitting a vaporized evaporation material to form an evaporation material layer on a substrate, the evaporation source comprising:

a cell retaining the evaporation material therein;

a cell cap installed on the upper part of the cell, and having a cell cap aperture for emitting the vaporized evaporation material, a cell cap extension portion that extends from the cell to the cell cap aperture, and an aperture end that defines the cell cap aperture;

an external wall placed in the outside of the cell to support a heating means set up at the outside of the cell;

a cover that is fixed to an upper end of the external wall, the cover having a cover extension portion that extends parallel to the cell cap extension portion of the cell cap and having a cover aperture, the cover extension portion of the cover being directly contacted to the cell cap extension portion of the cell cap, wherein the aperture end of the cell cap is formed to pass through the cover aperture from an interior to an exterior of the evaporation source; and at least two reflectors, each of the at least two reflectors having a circular plate shape, and comprising a body with a reflector aperture corresponding to the cell cap aperture and placed above the cell cap, a metal layer directly attached to an entire lower surface of the body and separated from the cell cap, and a plurality of supporting members mounted on an upper surface of the body to be contacted with an upper surface of the cell cap so that the cell cap maintain a predetermined temperature, wherein the body made of lower conductivity material has a reflector aperture corresponding to the cell cap aperture in the center thereof, the metal layer has low emissivity value, and each of the plurality of supporting members is contacted with the upper surface of the cell cap at a point, wherein an upper reflector of the at least two reflectors includes a plurality of projections formed on a lower surface of the upper reflector, a lower reflector of the at least two reflectors includes a plurality of recesses formed on an upper surface of the lower reflector, and the plurality of recessed are contacted with the plurality of projections at a point respectively, and wherein each of the plurality of recesses has an elliptical shape to prevent from being separated from the corresponding plurality of projections;

wherein the supporting member has a pin type end in order to minimize an area contacted with the cell cap.

2. The evaporation source of claim 1, wherein the body and the supporting member are made of $ZrO_2$, $Al_2O_3$, $TiO_2$, Mn, or Ti.

3. The evaporation source of claim 1, wherein the supporting member and the body are formed integrally or separately.

4. The evaporation source of claim 1, wherein the metal layer is made of Au, Ag, or Al.

5. The evaporation source of claim 4, wherein the metal layer is formed on the lower surface of the body by the thermal spray method, ECM (Electro Chemical Metalizing) method, or the electro plating method, wherein the thermal spray method comprises the flame spray method, the plasma spray method or HVOF (High Velocity Oxygen-Fuel).

6. The evaporation source of claim 1, wherein the body and the supporting member are made of $TiO_2$, Mn, or Ti.

* * * * *